(12) United States Patent
Osanai et al.

(10) Patent No.: US 7,340,828 B2
(45) Date of Patent: Mar. 11, 2008

(54) METHOD FOR PRODUCING METAL/CERAMIC BONDING CIRCUIT BOARD

(75) Inventors: Hideyo Osanai, Shiojiri (JP); Makoto Namioka, Shiojiri (JP); Susumu Ibaraki, Shiojiri (JP)

(73) Assignee: Dowa Mining Co., Ltd. (JP)

( * ) Notice: Subject to any disclaimer, the term of this patent is extended or adjusted under 35 U.S.C. 154(b) by 348 days.

(21) Appl. No.: 10/948,695

(22) Filed: Sep. 22, 2004

(65) Prior Publication Data

US 2005/0060887 A1   Mar. 24, 2005

(30) Foreign Application Priority Data

Sep. 22, 2003   (JP) ............................. 2003-329278

(51) Int. Cl.
*H05K 3/02*   (2006.01)

(52) U.S. Cl. ............................ 29/847; 29/829; 29/830; 29/831; 29/832; 29/841; 29/846; 228/124.1; 228/206; 228/245; 257/E23.006; 257/E23.106; 438/107; 438/108

(58) Field of Classification Search .................. 29/847, 29/829–832, 841, 846; 228/124.1, 206, 245; 257/E23.006, E23.106; 438/107, 108
See application file for complete search history.

(56) References Cited

U.S. PATENT DOCUMENTS 4,884,170 A * 11/1989 Ohki et al. .................. 361/794
2002/0050510 A1 * 5/2002 Osanai et al. ............... 228/245

FOREIGN PATENT DOCUMENTS

JP   2002-76551   3/2002

* cited by examiner

*Primary Examiner*—Tim Phan
(74) *Attorney, Agent, or Firm*—Bachman & LaPointe

(57) ABSTRACT

There is provided a method for producing a metal/ceramic bonding circuit board, which can form a fine pattern even if a circuit forming metal plate is thick and which can shorten the time required to carry out etching, when a molten metal is caused to contact to a ceramic substrate to be cooled and solidified to bond the circuit forming metal plate to the ceramic substrate to etch the circuit forming metal plate to form a metal circuit plate having a desired circuit pattern. A molten metal is caused to contact both sides of a ceramic substrate 10 to be cooled and solidified. Thus, a circuit forming metal plate 12 having a shape similar to a desired circuit pattern is bonded to one side of the ceramic substrate 10, and a metal base plate 14 is bonded to the other side thereof.

5 Claims, 4 Drawing Sheets

METHOD FOR PRODUCING METAL/CERAMIC BONDING CIRCUIT BOARD

CROSS REFERENCE TO RELATED APPLICATION

This application claims priority to Japanese Patent Application No. 2003-329278 filed on Sep. 22, 2003.

BACKGROUND OF THE INVENTION

1. Field of the Invention

The present invention generally relates to a method for producing a metal/ceramic bonding circuit board wherein a metal circuit plate is bonded to a ceramic substrate. More specifically, the invention relates to a method for producing a metal/ceramic bonding circuit board for use in a power module or the like.

2. Description of the Prior Art

As a conventional method for producing a metal/ceramic bonding circuit board for use in a power module or the like, there is known a method for producing a metal/ceramic bonding circuit board which has a metal circuit plate having a desired circuit pattern, the method comprising the steps of: cooling and solidifying a molten metal, which is fed onto a ceramic substrate, to bond a metal plate to the ceramic substrate; printing an etching resist having a desired pattern shape on the bonded metal plate by the screen printing or the like; etching the metal plate to form a circuit pattern; and removing the resist (see, e.g., Japanese Patent Laid-Open No. 2002-76551).

However, in a typical metal/ceramic bonding circuit board for use in a power module or the like, the thickness of a metal circuit plate is not less than hundreds micrometers, and is tens times as large as the thickness of a metal circuit plate of a printed circuit board usually using a paper or glass epoxy as an insulating material. Therefore, in the method disclosed in Japanese Patent Laid-Open No. 2002-76551, there is a problem in that the length of a skirt formed by etching and the amount of side etching caused by etching are large. For example, if the thickness of a metal circuit plate is in the range of from 0.4 mm to 0.6 mm and if an etching resist having a distance between patterns of 0.5 mm is formed, the insulating distance between patterns (the distance between bottoms) of the metal plate is a great distance of 0.9 to 1.4 mm at the shortest, and the distance between tops of metal circuit plates is greater than the distance between bottoms. If the metal circuit plate is thicker, there is a problem in that these distances are greater. In addition, as the thickness of the metal circuit plate increases, the time required to carry out etching increases, and the number of producing steps increases to increase production costs. Moreover, the resistance of the etching resist must be cared.

SUMMARY OF THE INVENTION

It is therefore an object of the present invention to eliminate the aforementioned problems and to provide a method for producing a metal/ceramic bonding circuit board, which can form a fine pattern even if a circuit forming metal plate is thick and which can shorten the time required to carry out etching, when a molten metal is caused to contact a ceramic substrate to be cooled and solidified to bond a circuit forming metal plate to the ceramic substrate to etch the circuit forming metal plate to form a metal circuit plate having a desired circuit pattern.

In order to accomplish the aforementioned and other objects, the inventors have diligently studied and found that, if a circuit forming metal plate is previously formed so as to have a shape similar to a circuit pattern by cooling and solidifying a molten metal contacting a ceramic substrate, it is possible to shorten the time required to carry out etching when a metal circuit plate having a desired circuit pattern is formed, and it is possible to form a fine pattern even if a circuit forming metal plate is thick.

According to one aspect of the present invention, there is provided a method for producing a metal/ceramic bonding circuit board, the method comprising the steps of: causing a molten metal to contact one side of a ceramic substrate; cooling and solidifying the molten metal contacting the one side of the ceramic substrate to bond a metal plate, which has a shape similar to a desired circuit pattern, to the one side of the ceramic substrate; and etching the metal plate to form a metal circuit plate having the desired circuit pattern.

In this method for producing a metal/ceramic bonding circuit board, a portion of the metal plate, which is bonded to the one side of the ceramic substrate, other than a portion substantially corresponding to the desired circuit pattern is preferably thinner than the portion substantially corresponding to the desired circuit pattern. The portion of the metal plate, which is bonded to the one side of the ceramic substrate, other than a portion substantially corresponding to the desired circuit pattern preferably has a thickness which is half or less that of the portion substantially corresponding to the desired circuit pattern. The portion substantially corresponding to the desired circuit pattern preferably has a thickness of 0.1 to 0.3 mm. The ceramic substrate is preferably arranged in a mold which has a recessed portion having a shape similar to the desired circuit pattern, and the molten metal is preferably injected into the recessed portion of the mold so as to contact the one side of the ceramic substrate. The molten metal is preferably caused to contact the other side of the ceramic substrate at the step of causing the molten metal to contact the one side of the ceramic substrate, and a metal member is preferably bonded to the other side of the ceramic substrate at the step of cooling and solidifying the molten metal contacting the one side of the ceramic substrate. The molten metal preferably contains aluminum as a principal component.

According to another aspect of the present invention, there is provided a method for producing a metal/ceramic bonding circuit board, the method comprising the steps of: preparing a mold having a recessed portion which has a shape similar to a desired circuit pattern; arranging a ceramic substrate in the mold so that the ceramic substrate is adjacent to the recessed portion; injecting a molten metal into the recessed portion of the mold so as to contact one side of the ceramic substrate arranged in the mold; cooling and solidifying the injected molten metal to bond a metal plate, which has a shape similar to the desired circuit pattern, to one side of the ceramic substrate; and etching the metal plate to form a metal circuit plate having the desired circuit pattern.

In this method for producing a metal/ceramic bonding circuit board, a portion of the recessed portion of the mold other than a portion substantially corresponding to the desired circuit pattern is preferably shallower than the portion substantially corresponding to the desired circuit pattern. The portion substantially corresponding to the desired circuit pattern preferably has a depth of 0.1 to 0.3 mm. The molten metal is preferably caused to contact the other side of the ceramic substrate at the step of injecting the molten metal so as to contact the one side of the ceramic substrate, and a metal member is preferably bonded to the other side of the ceramic substrate at the step of cooling and solidifying the molten metal to bond the metal plate to the one side of the ceramic substrate. The molten metal preferably contains aluminum as a principal component.

Furthermore, in a method for producing a metal/ceramic bonding circuit board according to the present invention, the reason why the shape of a metal plate bonded to a ceramic substrate is a shape similar to a circuit pattern, not the same shape as the circuit pattern, is that it is difficult to form a metal plate having the same shape as that the circuit pattern at a predetermined dimensional precision when the metal plate bonded to the ceramic substrate is formed by molding. In addition, in order to form a metal plate having the same shape as the circuit pattern, it is required to form each molten metal inlet in a mold for forming each circuit pattern by molding, so that it is difficult to produce such a complicated mold. Therefore, throughout the specification, the term "a shape similar to a circuit pattern" means a shape similar to a circuit pattern as similar as possible by molding. In particular, if a metal plate is formed between adjacent patterns so as to be thin, it is possible to form a metal plate having a shape similar to a circuit pattern without forming each molten metal inlet in the mold for forming each circuit pattern.

According to the present invention, when a molten metal is caused to contact a ceramic substrate to be cooled and solidified to bond a circuit forming metal plate to the ceramic substrate to etch the circuit forming metal plate to form a metal circuit plate having a desired circuit pattern, if the circuit forming metal pattern bonded to the ceramic substrate is previously formed so as to have a shape similar to the circuit pattern, it is possible to form a fine pattern even if a circuit forming metal plate is thick, and it is possible to considerably shorten the time required to carry out etching for forming a metal circuit plate having a desired circuit pattern.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, the preferred embodiment of a method for producing a metal/ceramic bonding circuit board according to the present invention will be described below.

First, a ceramic substrate is mounted in a mold, and a molten metal is fed into the mold to be cooled and solidified to produce a metal/ceramic bonding substrate wherein a metal base plate is bonded to one side of the ceramic substrate and a circuit forming metal plate is bonded to the other side thereof.

Figure 1A:
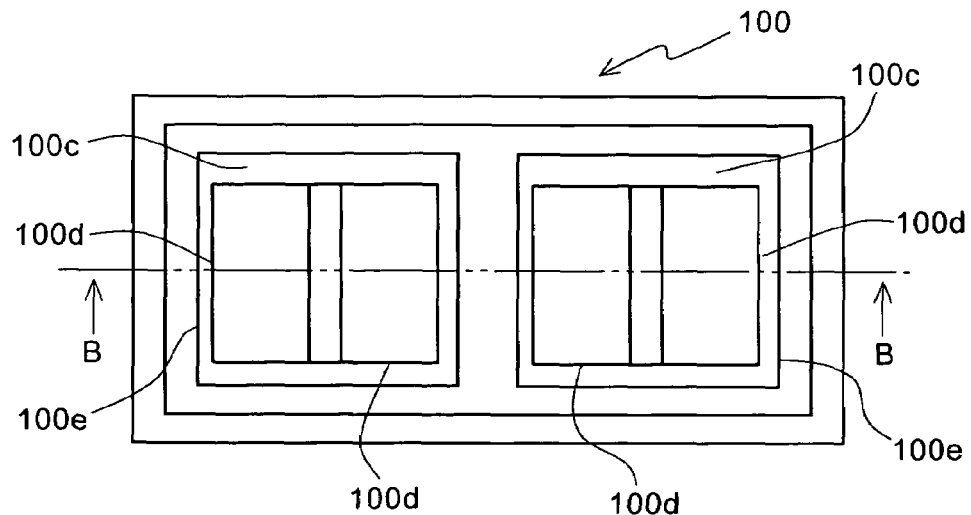
FIG. 1A is a plan view of a lower mold member of a mold for use in a preferred embodiment of a method for producing a metal/ceramic bonding circuit board according to the present invention.
Figure 1B:
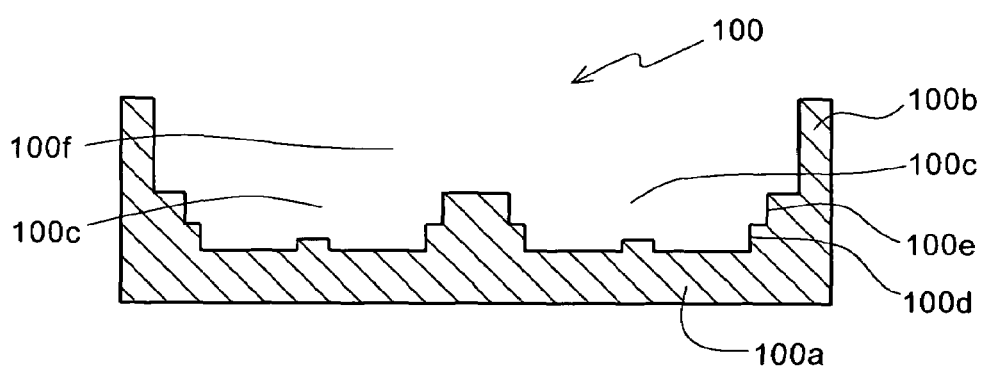
FIG. 1B is a sectional view taken along line B-B of FIG. 1A.
Figure 1C:
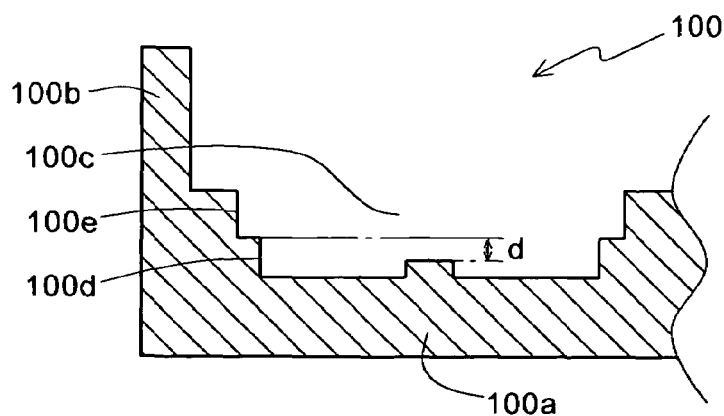
FIG. 1C is an enlarged view of part of FIG. 1B.

FIGS. 1A through 1C show an example of a lower mold member of a mold used for producing the metal/ceramic bonding substrate. As shown in FIGS. 1A and 1B, a lower mold member 100 comprises a bottom portion 100a having a substantially rectangular planar shape, and a side wall portion 100b extending from the peripheral edge portion of the bottom portion 100a upwards in a direction perpendicular to the bottom portion 100a. The top surface of the bottom portion 100a of the lower mold member 100 has one or a plurality of recessed portions 100c (two recessed portions 100c are shown in FIGS. 1A and 1B), each of which has a step-wise extending side wall. Each of the recessed portions 100c comprises: one or a plurality of metal circuit plate-forming portions 100d (four metal circuit plate forming portions 100d are shown in FIGS. 1A and 1B), each of which has a planer shape similar to a circuit pattern of a corresponding one of metal circuit plates and each of which substantially has the same depth as the thickness of the corresponding one of the metal circuit plates; and one or a plurality of ceramic substrate housing portions 100e (two ceramic substrate housing portions 100e are shown in FIGS. 1A and 1B), each of which is formed above the metal circuit plate forming portions 100d so as to be adjacent thereto and each of which substantially has the same shape and size as those of the ceramic substrate. As shown in FIG. 1C, in each of the metal circuit plate forming portions 100d, the depth of a portion between adjacent patterns is smaller than the depth of a portion, which substantially corresponds to the circuit pattern of the metal circuit plate, by d. Of a space defined by putting an upper mold member (not shown) having a substantially rectangular planar shape on the lower mold member 100, a portion other than the recessed portions 100c of the lower mold member 100 defines a metal base plate forming portion 100f. Furthermore, the upper mold member has a molten metal inlet (not shown) for injecting a molten metal into the mold. The lower mold member 100 has a molten metal passage (not shown), which extends between the metal base plate forming portion 100f and the metal circuit plate forming portions 100d, so as to allow the metal base plate forming portion 100f to be communicated with the metal circuit plate forming portions 100d if ceramic substrates are housed in the ceramic substrate housing portions 100e.

Figure 2A:
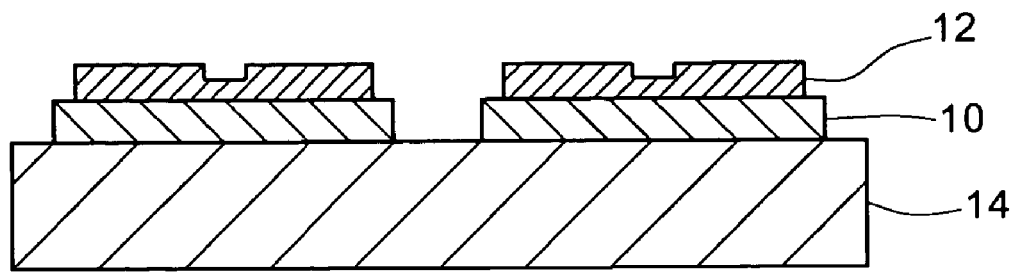
FIGS. 2A through 2C are sectional views showing producing steps in the preferred embodiment of a method for producing a metal/ceramic bonding circuit board according to the present invention.

After the ceramic substrates are housed in the ceramic substrate housing portions 100e of the lower mold member 100 of the mold, a molten metal is injected into the metal base plate forming portion 100f to be filled in the metal circuit plate forming portions 100d via the molten metal passage (not shown). Thereafter, the molten metal is cooled to be solidified, so that it is possible to produce an integrated metal/ceramic bonding substrate shown in FIG. 2A wherein a metal base plate 14 is bonded directly to one side of each of ceramic substrates 10, and circuit forming metal plates 12 having a shape similar to a circuit pattern are bonded directly to the other side of the ceramic substrates 10.

Figure 2B:
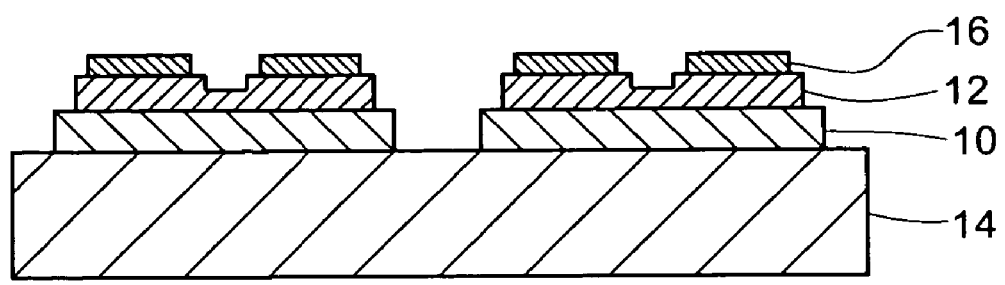
Figure 2C:
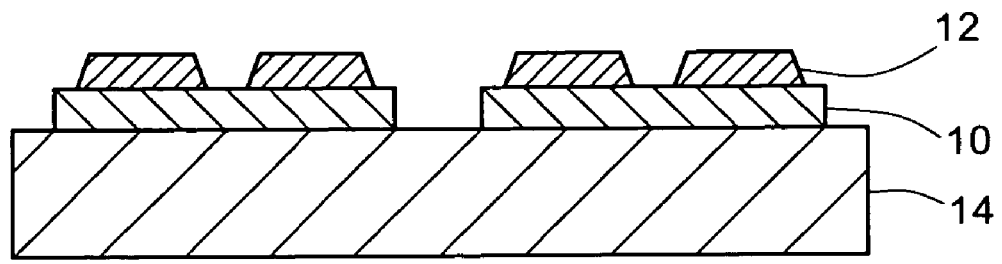

Then, as shown in FIG. 2B, an etching resists 16 having a predetermined shape are printed on the surface of each of the circuit forming metal plates 12 to etch the circuit forming metal plates 12 with an etchant, such as a ferric chloride solution, to form metal circuit plates 12 having a desired circuit pattern. Thereafter, as shown in FIG. 2C, the resists 16 are removed to obtain a metal/ceramic bonding circuit board having the metal circuit plates having the desired circuit pattern.

Examples of a method for producing a metal/ceramic bonding circuit board according to the present invention will be described below in detail.

EXAMPLE 1

The following carbon mold was prepared. In the bottom of the lower mold member of the carbon mold, there is formed a metal circuit plate forming portion being a recessed portion which substantially has the same shape and size as those of a circuit forming metal plate (see FIG. 3A) wherein the thickness of a portion substantially corresponding to a circuit pattern is 0.6 mm, the thickness of a portion between adjacent patterns is 0.3 mm, and the distance therebetween is 0.8 mm. In the bottom of the lower mold member of the carbon mold, a ceramic substrate housing portion being a recessed portion, which substantially has the same shape and size as those of a ceramic substrate having a size of 32.5 mm×40 mm×0.635 mm, is formed above the metal circuit plate forming portion so as to be adjacent thereto. In the lower mold member of the carbon mold, a metal base plate forming portion is defined above the ceramic substrate forming portion so as to be adjacent thereto. The carbon mold also has a molten metal passage extending between the metal base plate forming portion and the metal circuit plate forming portion.

Then, a ceramic substrate of aluminum nitride having a size of 32.5 mm×40 mm×0.635 mm was housed in the ceramic substrate housing portion of the lower mold member of the mold, and the lower mold member was closed by an upper mold member. Then, a molten aluminum was fed from a molten metal inlet into the metal base plate forming portion to be filled in the metal circuit plate forming portion via the molten metal passage. Thereafter, the molten metal was cooled to be solidified to obtain an integrated metal/ceramic bonding substrate shown in FIG. 3A wherein a metal base plate 14 was bonded directly to one side of a ceramic substrate 10, and a circuit forming metal plate 12 having a shape similar to a circuit pattern was bonded directly to the other side of the ceramic substrate 10.

Figure 3A:
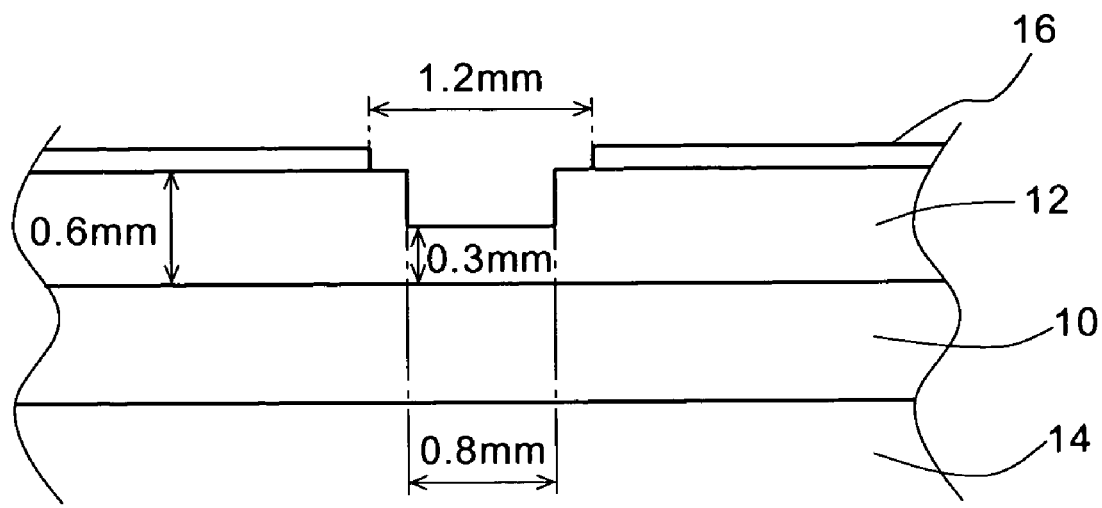
FIGS. 3A and 3B are illustrations for explaining the steps of producing a metal/ceramic bonding circuit board in Examples 1 through 8.
Figure 3B:
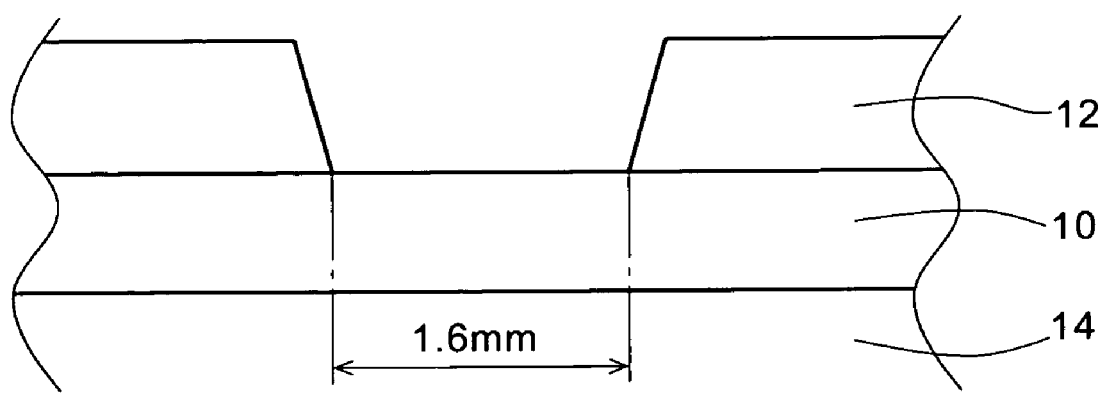

Then, as shown in FIG. 3A, etching resists 16 were printed on the surface of the circuit forming metal plate of the metal/ceramic bonding substrate so as to be spaced from each other by 1.2 mm between adjacent patterns. Then, the circuit forming metal plate was etched with a ferric chloride solution to form metal circuit plates having a desired circuit pattern. Thereafter, the etching resists 16 were removed to obtain a metal/ceramic bonding circuit board having the metal circuit plates having the desired circuit pattern wherein the distance (insulating distance) between pattern bottoms of adjacent patterns was 1.6 mm.

EXAMPLES 2 THROUGH 4

Metal/ceramic bonding circuit boards were obtained by the same method as that in Example 1, except that the size of the ceramic substrate was 32.5 mm×74 mm×0.635 mm (Example 2), 32.5 mm×40 mm×0.25 mm (Example 3) and 32.5 mm×74 mm×0.25 mm (Example 4), respectively, and that the size of the ceramic substrate housing portion of the lower mold member was substantially equal to the size of the ceramic substrate.

EXAMPLES 5 THROUGH 8

Metal/ceramic bonding circuit boards were obtained by the same methods as those in Examples 1 through 4, respectively, except that an alumina substrate was used as the ceramic substrate.

EXAMPLE 9

Figure 4A:
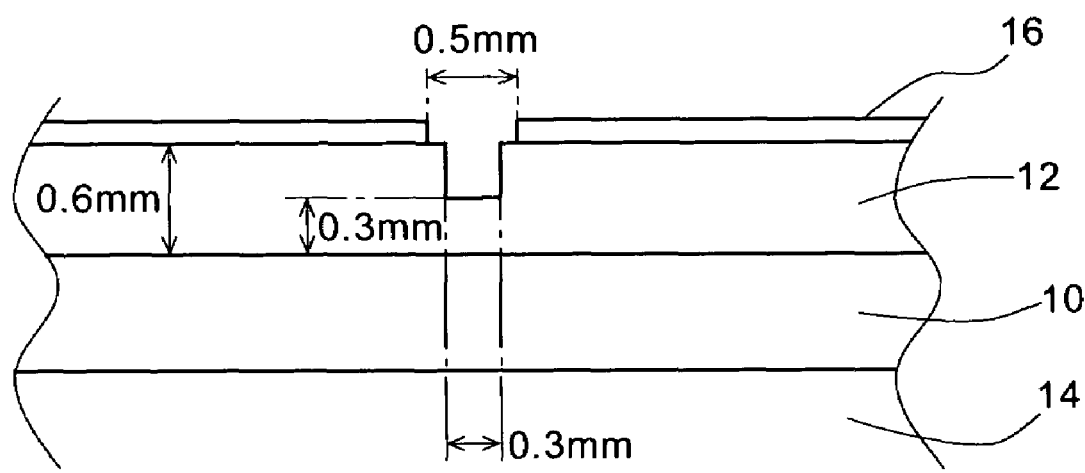
FIGS. 4A and 4B are illustrations for explaining the steps of producing a metal/ceramic bonding circuit board in Examples 9 through 16.
Figure 4B:
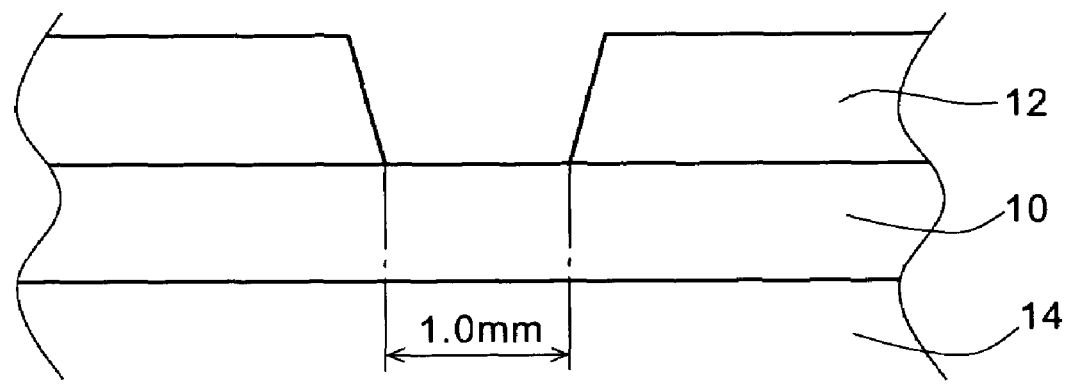

A metal/ceramic bonding circuit board having a metal circuit plate 12 having a desired circuit pattern, wherein the distance (insulating distance) between pattern bottoms of adjacent patterns was 1.0 mm as shown in FIG. 4B, was obtained by the same method as that in Example 1, except that the distance between adjacent patterns of a circuit forming metal plate 12 was 0.3 mm and that the distance between etching resists 16 printed on adjacent patterns was 0.5 mm as shown in FIG. 4A.

EXAMPLES 10 THROUGH 12

Metal/ceramic bonding circuit boards were obtained by the same method as that in Example 9, except that the size of the ceramic substrate was 32.5 mm×7.4 mm×0.635 mm (Example 10), 32.5 mm×40 mm×0.25 mm (Example 11) and 32.5 mm×74 mm×0.25 mm (Example 12), respectively, and that the size of the ceramic substrate housing portion of the lower mold member was substantially equal to the size of the ceramic substrate.

EXAMPLES 13 THROUGH 16

Metal/ceramic bonding circuit boards were obtained by the same methods as those in Examples 9 through 12, except that an alumina substrate was used as the ceramic substrate.

COMPARATIVE EXAMPLES 1 THROUGH 16

Metal/ceramic bonding circuit boards were obtained by the same method as those in Examples 1 through 16, expect that the depth of the metal circuit plate forming portion was a constant depth of 0.6 mm.

In Comparative Examples 1 through 16, the time required to carry out etching was about 30 minutes, whereas in Examples 1 through 16, the time required to carry out etching was about 15 minutes, so that it was found that the time required to carry out etching was considerably shortened in Examples 1 through 16. In addition, in Examples 1 through 8 wherein the distance between the etching resists 16 printed on adjacent patterns was 1.2 mm, it was possible to form a desired circuit pattern having an insulating distance (a distance between pattern bottoms) of 1.6 mm, whereas in Comparative Examples 1 through 8 wherein the distance between the etching resists was similarly 1.2 mm, it was not possible to form a desired circuit pattern since the insulating distance was 2.1 mm. Moreover, in Examples 9 through 16 wherein the distance between the etching resists 16 printed on adjacent patterns was 0.5 mm, it was possible to form a desired fine pattern having an insulating distance of 1.0 mm, whereas in Comparative Examples 9 through 16 wherein the distance between the etching resists was similarly 0.5 mm, it was not possible to form a desired circuit pattern since the insulating distance was 1.4 mm.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A method for producing a metal/ceramic bonding circuit board, said method comprising the steps of:
   preparing a mold having a recessed portion;
   arranging a ceramic substrate in the mold so that the ceramic substrate is adjacent to the recessed portion;
   injecting a molten metal into the recessed portion of the mold so as to contact one side of the ceramic substrate arranged in the mold;
   cooling and solidifying the injected molten metal to bond a metal plate to one side of the ceramic substrate; and
   etching the metal plate, which is bonded to the one side of the ceramic substrate, to form a metal circuit plate having a desired circuit pattern,
   wherein said recessed portion has a shape similar to the desired circuit pattern for shortening the time required to etch the metal plate.

2. The method for producing a metal/ceramic bonding circuit board as set forth in claim 1, wherein a portion of said recessed portion of said mold other than a portion substantially corresponding to said desired circuit pattern is shallower than the portion substantially corresponding to said desired circuit pattern.

3. A method for producing a metal/ceramic bonding circuit board as set forth in claim 2, wherein said portion of said recessed portion of said mold other than said portion substantially corresponding to said desired circuit pattern has a depth of 0.1 to 0.3 mm.

4. A method for producing a metal/ceramic bonding circuit board as set forth in claim 1, wherein said molten metal is caused to contact the other side of said ceramic substrate at the step of injecting the molten metal so as to contact the one side of the ceramic substrate, and a metal member is bonded to the other side of said ceramic substrate at the step of cooling and solidifying the molten metal to bond the metal plate to the one side of the ceramic substrate.

5. A method for producing a metal/ceramic bonding circuit board as set forth in claim 1, wherein said molten metal contains aluminum as a principal component.

* * * * *